US011283080B2

(12) United States Patent
Huang et al.

(10) Patent No.: US 11,283,080 B2
(45) Date of Patent: Mar. 22, 2022

(54) ELECTRODEPOSITED COPPER FOIL, CURRENT COLLECTOR, ELECTRODE, AND LITHIUM ION SECONDARY BATTERY COMPRISING THE SAME

(71) Applicant: CHANG CHUN PETROCHEMICAL CO., LTD., Taipei (TW)

(72) Inventors: Huei-Fang Huang, Taipei (TW); Ting-Chun Lai, Taipei (TW); Kuei-Sen Cheng, Taipei (TW); Jui-Chang Chou, Taipei (TW); Yao-Sheng Lai, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 17/259,333

(22) PCT Filed: Jan. 15, 2020

(86) PCT No.: PCT/CN2020/072158
§ 371 (c)(1),
(2) Date: Jan. 11, 2021

(87) PCT Pub. No.: WO2020/156159
PCT Pub. Date: Aug. 6, 2020

(65) Prior Publication Data
US 2021/0242467 A1 Aug. 5, 2021

Related U.S. Application Data

(63) Continuation of application No. 16/429,921, filed on Jun. 3, 2019, now Pat. No. 10,581,081.
(Continued)

(51) Int. Cl.
*H01M 4/66* (2006.01)
*H01M 4/04* (2006.01)
(Continued)

(52) U.S. Cl.
CPC ............ *H01M 4/661* (2013.01); *B32B 15/01* (2013.01); *B32B 15/08* (2013.01); *B32B 15/20* (2013.01); *C25D 1/04* (2013.01); *C25D 3/04* (2013.01); *C25D 3/12* (2013.01); *C25D 3/22* (2013.01); *C25D 3/38* (2013.01); *C25D 5/10* (2013.01); *C25D 5/14* (2013.01); *C25D 5/16* (2013.01); *C25D 5/48* (2013.01); *H01M 4/0469* (2013.01); *H01M 4/70* (2013.01); *H01M 10/0525* (2013.01); *H05K 1/0242* (2013.01); *H05K 1/09* (2013.01); *H05K 1/18* (2013.01); *H05K 1/181* (2013.01); *H05K 3/384* (2013.01); *H05K 3/389* (2013.01); *B32B 2255/06* (2013.01); *B32B 2255/205* (2013.01); *B32B 2255/28* (2013.01); *B32B 2307/202* (2013.01); *B32B 2457/08* (2013.01); *H01M 2004/027* (2013.01); *H05K 2201/0338* (2013.01);
(Continued)

(58) Field of Classification Search
CPC ......... B32B 15/01; B32B 15/08; B32B 15/20; B32B 2255/06; B32B 2255/205; B32B 2255/28; B32B 2307/202; B32B 2457/08; C25D 1/04; C25D 3/04; C25D 3/08; C25D 3/12; C25D 3/22; C25D 3/38; C25D 5/10; C25D 5/14; C25D 5/16; C25D 5/48; C25D 9/08; H01M 10/052; H01M 10/0525; H01M 2004/021; H01M 2004/027; H01M 4/0469; H01M 4/661; H01M 4/70; H05K 1/0242; H05K 1/09; H05K 1/18; H05K 1/181; H05K 2201/0338; H05K 2201/0355; H05K 2201/0373; H05K 2201/10522; H05K 2201/2054; H05K 2203/0307; H05K 3/384; H05K 3/389
See application file for complete search history.

(56) References Cited

U.S. PATENT DOCUMENTS 9,899,683 B2   2/2018  Lee et al.
10,205,170 B1  2/2019  Huang et al.
(Continued)

FOREIGN PATENT DOCUMENTS

CN   1543292 A   11/2004
CN   2752274 Y   1/2006
(Continued)

OTHER PUBLICATIONS

Lai et al. "U.S. Appl. No. 16/654,723, filed Oct. 16, 2019", US.
(Continued)

Primary Examiner — Carlos Barcena
(74) Attorney, Agent, or Firm — WPAT, PC

(57) ABSTRACT

Provided are an electrodeposited copper foil, a current collector, an electrode, and a lithium-ion secondary battery comprising the same. The electrodeposited copper foil has a deposited side and a drum side opposite the deposited side. In a first aspect, ΔRS between the deposited side and the drum side is at most about 95 MPa, and the deposited side exhibits a Vv in a range from about 0.15 $\mu m^3/\mu m^2$ to about 1.35 $\mu m^3/\mu m^2$. In a second aspect, the deposited side has a Sku of about 1.5 to about 6.5 and the deposited side exhibits a Vv in a range from about 0.15 $\mu m^3/\mu m^2$ to about 1.35 $\mu m^3/\mu m^2$. The characteristics are beneficial to improve the quality of the electrodeposited copper foil, thereby extending the charge-discharge cycle life of a lithium-ion secondary battery comprising the same.

30 Claims, 2 Drawing Sheets

Related U.S. Application Data

(60) Provisional application No. 62/800,263, filed on Feb. 1, 2019.

(51) Int. Cl.

| | | |
|---|---|---|
| *H01M 10/0525* | (2010.01) | |
| *H01M 4/70* | (2006.01) | |
| *C25D 1/04* | (2006.01) | |
| *C25D 3/04* | (2006.01) | |
| *C25D 3/12* | (2006.01) | |
| *C25D 3/22* | (2006.01) | |
| *C25D 3/38* | (2006.01) | |
| *C25D 5/14* | (2006.01) | |
| *C25D 5/16* | (2006.01) | |
| *C25D 5/48* | (2006.01) | |
| *C25D 5/10* | (2006.01) | |
| *B32B 15/01* | (2006.01) | |
| *B32B 15/08* | (2006.01) | |
| *B32B 15/20* | (2006.01) | |
| *H05K 1/09* | (2006.01) | |
| *H05K 1/18* | (2006.01) | |
| *H05K 3/38* | (2006.01) | |
| *H05K 1/02* | (2006.01) | |
| *H01M 4/02* | (2006.01) | |

(52) U.S. Cl.
CPC ............... *H05K 2201/0355* (2013.01); *H05K 2201/0373* (2013.01); *H05K 2201/10522* (2013.01); *H05K 2201/2054* (2013.01); *H05K 2203/0307* (2013.01); *Y10T 428/12431* (2015.01)

(56) References Cited

U.S. PATENT DOCUMENTS

| | | |
|---|---|---|
| 10,424,793 B2 | 9/2019 | Cheng et al. |
| 10,622,637 B1 | 4/2020 | Huang et al. |
| 2004/0029006 A1 | 2/2004 | Otsuka et al. |
| 2006/0210823 A1 | 9/2006 | Sano et al. |
| 2008/0280159 A1 | 11/2008 | Iwakiri et al. |
| 2011/0127074 A1 | 6/2011 | Takahashi |
| 2011/0223455 A1 | 9/2011 | Kimura et al. |
| 2012/0111733 A1 | 5/2012 | Tsai et al. |
| 2013/0011690 A1 | 1/2013 | Arai et al. |
| 2013/0040162 A1 | 2/2013 | Fujisawa et al. |
| 2014/0264417 A1 | 9/2014 | Kobayashi et al. |
| 2017/0042036 A1 | 2/2017 | Miyamoto |
| 2017/0320247 A1 | 11/2017 | Aizawa et al. |
| 2018/0083309 A1 | 3/2018 | Ho et al. |
| 2018/0245230 A1 | 8/2018 | Sonoda et al. |
| 2018/0279482 A1 | 9/2018 | Ishii et al. |
| 2018/0282890 A1 | 10/2018 | Chun et al. |
| 2019/0145014 A1 | 5/2019 | Chen et al. |
| 2019/0249322 A1 | 8/2019 | Lee et al. |
| 2020/0096886 A1 | 3/2020 | Sasaki et al. |

FOREIGN PATENT DOCUMENTS

| | | | |
|---|---|---|---|
| CN | 1788111 | A | 6/2006 |
| CN | 1995469 | A | 7/2007 |
| CN | 101098005 | A | 1/2008 |
| CN | 101669237 | A | 3/2010 |
| CN | 102203326 | A | 9/2011 |
| CN | 102234823 | A | 11/2011 |
| CN | 102418129 | A | 4/2012 |
| CN | 102965698 | A | 3/2013 |
| CN | 103392028 | A | 11/2013 |
| CN | 103911633 | A | 7/2014 |
| CN | 104125711 | A | 10/2014 |
| CN | 104603333 | A | 5/2015 |
| CN | 104619889 | A | 5/2015 |
| CN | 104717831 | A | 6/2015 |
| CN | 104781973 | A | 7/2015 |
| CN | 104812945 | A | 7/2015 |
| CN | 104884409 | A | 9/2015 |
| CN | 104928726 | A | 9/2015 |
| CN | 104992998 | A | 10/2015 |
| CN | 105323958 | A | 2/2016 |
| CN | 105556004 | A | 5/2016 |
| CN | 105813379 | A | 7/2016 |
| CN | 105814242 | A | 7/2016 |
| CN | 105934307 | A | 9/2016 |
| CN | 105986288 | A | 10/2016 |
| CN | 106103082 | A | 11/2016 |
| CN | 106304615 | A | 1/2017 |
| CN | 106455310 | A | 2/2017 |
| CN | 106455341 | A | 2/2017 |
| CN | 106455342 | A | 2/2017 |
| CN | 106558703 | A | 4/2017 |
| CN | 106953099 | A | 7/2017 |
| CN | 106982507 | A | 7/2017 |
| CN | 107018624 | A | 8/2017 |
| CN | 107041064 | A | 8/2017 |
| CN | 107801366 | A | 3/2018 |
| CN | 107871847 | A | 4/2018 |
| CN | 107946596 | A | 4/2018 |
| CN | 108124392 | A | 6/2018 |
| CN | 108270015 | A | 7/2018 |
| CN | 108270016 | A | 7/2018 |
| CN | 108306022 | A | 7/2018 |
| CN | 108345195 | A | 7/2018 |
| CN | 108690975 | A | 10/2018 |
| CN | 108697006 | A | 10/2018 |
| CN | 108728874 | A | 11/2018 |
| CN | 109788627 | A | 5/2019 |
| CN | 110004467 | A | 7/2019 |
| EP | 3067442 | A | 9/2016 |
| JP | H05-235542 | A | 9/1993 |
| JP | 2000-045091 | A | 2/2000 |
| JP | 2000-119892 | A | 4/2000 |
| JP | 2001-192879 | A | 7/2001 |
| JP | 2002-194585 | A | 7/2002 |
| JP | 2002-298854 | A | 10/2002 |
| JP | 2004-002953 | A | 1/2004 |
| JP | 2004-250753 | A | 9/2004 |
| JP | 2006-253345 | A | 9/2006 |
| JP | 3850155 | B2 | 11/2006 |
| JP | 2010-282957 | A | 12/2010 |
| JP | 2011-192879 | A | 9/2011 |
| JP | 2012-136736 | A | 7/2012 |
| JP | 2012-172198 | A | 9/2012 |
| JP | 2013-133514 | A | 7/2013 |
| JP | 2014-132106 | A | 7/2014 |
| JP | 2014-194067 | A | 10/2014 |
| JP | 2014-208910 | A | 11/2014 |
| JP | 2015-042765 | A | 3/2015 |
| JP | 5788062 | B1 | 9/2015 |
| JP | 2016-009526 | A | 1/2016 |
| JP | 2016-125126 | A | 7/2016 |
| JP | 2016-160503 | A | 9/2016 |
| JP | 2017-025409 | A | 2/2017 |
| JP | 2017-036495 | A | 2/2017 |
| JP | 2017-038043 | A | 2/2017 |
| JP | 2017-076618 | A | 4/2017 |
| JP | 2017-203219 | A | 11/2017 |
| JP | 2018-026589 | A | 2/2018 |
| JP | 2018-028147 | A | 2/2018 |
| JP | 2018-123430 | A | 8/2018 |
| JP | 2018-524772 | A | 8/2018 |
| JP | 2018-141230 | A | 9/2018 |
| JP | 2018-165411 | A | 10/2018 |
| JP | 2018-178261 | A | 11/2018 |
| JP | 2019-099911 | A | 6/2019 |
| JP | 6860706 | B2 | 4/2021 |
| KR | 10-2012-0068834 | A | 6/2012 |
| KR | 10-2013-0127031 | A | 11/2013 |
| KR | 10-2015-0021260 | A | 3/2015 |
| KR | 10-1502373 | B1 | 3/2015 |
| KR | 10-2015-0062230 | A | 6/2015 |
| KR | 10-2017-0046822 | A | 5/2017 |

(56) References Cited

FOREIGN PATENT DOCUMENTS

| | | |
|---|---|---|
| KR | 10-2018-0020927 A | 2/2018 |
| KR | 10-2018-0080512 A | 7/2018 |
| TW | 201139752 A | 11/2011 |
| TW | 201219606 A | 5/2012 |
| TW | 201301641 A | 1/2013 |
| TW | I417424 B | 12/2013 |
| TW | 201428139 A | 7/2014 |
| TW | 201512466 A | 4/2015 |
| TW | I482882 B | 5/2015 |
| TW | I501865 B | 10/2015 |
| TW | 201706459 A | 2/2017 |
| TW | 201716594 A | 5/2017 |
| TW | 201717712 A | 5/2017 |
| TW | 201718270 A | 6/2017 |
| TW | 201718937 A | 6/2017 |
| TW | 201722219 A | 6/2017 |
| TW | 201726961 A | 8/2017 |
| TW | 201738413 A | 11/2017 |
| TW | 201742212 A | 12/2017 |
| TW | 201809302 A | 3/2018 |
| TW | 201825717 A | 7/2018 |
| TW | 201829183 A | 8/2018 |
| TW | 201831733 A | 9/2018 |
| TW | 201831733 A | 9/2018 |
| TW | 201832922 A | 9/2018 |
| TW | 201834303 A | 9/2018 |
| TW | 201837238 A | 10/2018 |
| TW | 201839147 A | 11/2018 |
| TW | 202030340 A | 8/2020 |
| WO | WO 2007/105635 A | 9/2007 |
| WO | WO 2008/132987 A1 | 11/2008 |
| WO | WO 2014/065431 A1 | 5/2014 |
| WO | WO 2014/081041 A1 | 5/2014 |
| WO | WO 2015/104999 A1 | 7/2015 |
| WO | WO 2017/006739 A | 1/2017 |
| WO | WO 2017/051767 A1 | 3/2017 |
| WO | WO 2018/110579 A1 | 6/2018 |
| WO | WO 2018/207786 A1 | 11/2018 |
| WO | WO 2019/027174 A1 | 2/2019 |

OTHER PUBLICATIONS

Huang et al. "U.S. Appl. No. 16/694,412, filed Nov. 25, 2019", US.
Lai et al. "U.S. Appl. No. 16/715,284, filed Dec. 16, 2019", US.
Huang et al. "U.S. Appl. No. 16/694,434, filed Nov. 25, 2019", US.
USPTO, Non-Final Office Action dated Aug. 23, 2019 (U.S. Appl. No. 16/429,921).
C.-H Huang et al., Pulsed Deposition of Ultra-thin Copper Foils, Plating & Surface Finishing, Sep. 2004.
USPTO, Notice of Allowance dated Dec. 12, 2019 (U.S. Appl. No. 16/429,921).
USPTO, Non-Final Office Action dated Jan. 3, 2020 (U.S. Appl. No. 16/654,723).
Belov et al., Correlation between 3d texture of steel substrate and tin-coated surface with various coating masses, 2018.
USPTO, Notice of Allowance dated Jan. 15, 2020 (U.S. Appl. No. 16/584,157).
USPTO, Non-Final Office Action dated Jan. 29, 2020 (U.S. Appl. No. 16/694,434).
USPTO, Non-Final Office Action dated Feb. 10, 2020 (U.S. Appl. No. 16/694,412).
USPTO, Non-Final Office Action dated Feb. 18, 2020 (U.S. Appl. No. 16/715,284).
Japane Patent Office, Notice of Reasons for Refusal dated Mar. 10, 2020 (JP2020-004656).
Taiwan Patent Office, Office Action dated Mar. 18, 2020 (TW109101362).
China Patent Office, International Search Report dated Mar. 24, 2020 (PCT/CN2020/072300).
China Patent Office, International Search Report dated Mar. 26, 2020 (PCT/CN2020/072312).
USPTO, Final Office Action dated Apr. 7, 2020 (U.S. Appl. No. 16/654,723).
Gadelmawla et al., Roughness Parameters, 2002, Journal of Materials Processing Technology.
Ficker et al., Surface Roughness and Porosity of Hydrated Cement Pastes, 2011, ACTA Polytechnica vol. 51 No. 3/2011.
China Patent Office, International Search Report dated Apr. 8, 2020 (PCT/CN2020/072158).
China Patent Office, International Search Report dated Apr. 13, 2020 (PCT/CN2020/072305).
China Patent Office, International Search Report dated Apr. 15, 2020 (PCT/CN2020/072282).
China Patent Office, International Search Report dated Apr. 21, 2020 (PCT/CN2020/072157).
USPTO, Final Office Action dated Apr. 22, 2020 (U.S. Appl. No. 16/715,284).
USPTO, Final Office Action dated Apr. 22, 2020 (U.S. Appl. No. 16/694,434).
USPTO, Final Office Action dated Apr. 22, 2020 (U.S. Appl. No. 16/694,412).
Korea Patent Office, Office Action dated May 7, 2020 (KR10-2020-0005565).
Taiwan Patent Office, Notice of Allowance dated May 25, 2020 (TW109101364).
EPO, European Search Report dated Jun. 5, 2020 (EP20152064.0).
Taiwan Patent Office, Notice of Allowance dated Jun. 15, 2020 (TW109101373).
EPO, European Search Report dated Jun. 16, 2020 (EP20151885.9).
Taiwan Patent Office, Office Action dated Jul. 9, 2020 (TW109101372).
USTO, Non-Final Office Action dated Jul. 27, 2020 (U.S. Appl. No. 16/654,723).
Taiwan Patent Office, Office Action dated Aug. 14, 2020 (TW109101285).
Japan Patent Office, Notice of Reasons for Refusal dated Aug. 18, 2020 (JP2020-004660).
Taiwan Patent Office, Notice of Allowance dated Aug. 31, 2020 (TW109101360).
Korea Patent Office, Office Action dated Aug. 31, 2020 (KR10-2020-0005565).
Taiwan Patent Office, Office Action dated Sep. 4, 2020 (TW109101301).
Taiwan Patent Office, Office Action dated Sep. 4, 2020 (TW109101355).
Korea Patent Office, Office Action dated Sep. 7, 2020 (KR10-2020-0005338).
Taiwan Patent Office, Office Action dated Sep. 11, 2020 (TW109101361).
Taiwan Patent Office, Office Action dated Sep. 16, 2020 (TW109101365).
Japan Patent Office, Office Action dated Oct. 8, 2020 (JP2020-004658).
Japan Patent Office, Notice of Reasons for Refusal dated Oct. 13, 2020 (JP2020-004661).
Japan Patent Office, Office Action dated Oct. 20, 2020 (JP2020004659).
Korea Patent Office, Office Action dated Oct. 26, 2020 (KR10-2020-0005542).
China Patent Office, Office Action dated Nov. 9, 2020 (CN202010040365.2).
China Patent Office, Office Action dated Nov. 12, 2020 (CN202010040377.5).
Korea Patent Office, Office Action dated Nov. 14, 2020 (KR10-2020-0005476).
Taiwan Patent Office, Office Action dated Nov. 16, 2020 (TW10921103320).
China Patent Office, Office Action dated Dec. 1, 2020 (CN202010040373.7).
Korea Patent Office, Office Action dated Dec. 1, 2020 (KR10-2020-0005337).
Japan Patent Office, Notice of Reasons for Refusal dated Dec. 1, 2020 (JP2020-004660).
China Patent Office, Office Action dated Dec. 18, 2020 (CN202010040543.1).
China Patent Office, Office Action dated Dec. 21, 2020 (CN202010044774.X).

(56) References Cited

OTHER PUBLICATIONS

Korea Patent Office, Office Action dated Jan. 19, 2021 (KR10-2020-0005338).
Korea Patent Office, Rejection dated Jan. 22, 2021 (KR10-2020-0005565).
Taiwan Patent Office, Office Action dated Apr. 12, 2021(TW109101350).
Japan Patent Office, Office Action dated Apr. 27, 2021(JP2020-004657).
Japan Patent Office, Notice of Allowance dated Apr. 27, 2021(JP2020-014029).
Korea Patent Office, Office Action dated Apr. 29, 2021(KR10-2020-0005475).
China Patent Office, Rejection dated May 6, 2021(CN202010044774.X).
Korea Patent Office, Office Action dated May 7, 2021(KR10-2021-0024954).
China Patent Office, Rejection dated May 8, 2021(CN202010040543.1).
China Patent Office, Office Action dated May 24, 2021(CN202010040377.5).
Korea Patent Office, Notice of Allowance dated May 24, 2021(KR10-2021-7003753).
Taiwan Patent Office, Office Action dated Jun. 7, 2021(TW109101297).
Korea Patent Office, Office Action dated Jul. 1, 2021(KR10-2020-0011008).
Japan Patent Office, Office Action dated Aug. 3, 2021(JP2021-506268).
Korea Patent Office, Notice of Allowance dated Oct. 1, 2021(KR10-2021-7001664).
China Patent Office, Office Action dated Oct. 11, 2021(CN202010040377.5).
China Patent Office, Office Action dated Oct. 9, 2021(CN202080001237.5).
International Bureau, International preliminary report dated Aug. 12, 2021(PCT/CN2020/072158).
International Bureau, International preliminary report dated Aug. 12, 2021(PCT/CN2020/072157).
Japan Patent Office, Office Action dated Oct. 26 ,2021(JP2021-503555).
Japan Patent Office, Notice of Allowance dated Nov. 16, 2021 (JP2021-506268).
Korea Patent Office, Final Rejection dated Nov. 18, 2021 (KR10-2021-0024954).
Japan Patent Office, Office Action dated Jan. 4, 2022 (JP2021-500102).
China Patent Office, Office Action dated Jan. 7, 2022 (CN202010043439.8).
China Patent Office, Notice of Allowance dated Jan. 11, 2022(CN202080001237.5).

ELECTRODEPOSITED COPPER FOIL, CURRENT COLLECTOR, ELECTRODE, AND LITHIUM ION SECONDARY BATTERY COMPRISING THE SAME

CROSS-REFERENCE TO RELATED APPLICATION

This application is a U.S. national stage application under 35 U.S.C. § 371 of PCT/CN2020/072158 filed on Jan. 15, 2020, which claims the benefit under 35 U.S.C. § 119(e) of U.S. Provisional Application No. 62/800,263 filed on Feb. 1, 2019 and U.S. application Ser. No. 16/429,921 filed on Jun. 3, 2019. The contents of the prior applications are incorporated herein by reference in their entirety.

BACKGROUND

1. Field of the Disclosure

The instant disclosure relates to an electrodeposited copper foil, particularly to an electrodeposited copper foil for a lithium-ion secondary battery. In addition, the instant disclosure relates to a current collector, an electrode, and a lithium-ion secondary battery.

2. Description of the Prior Arts

Lithium-ion secondary batteries have both high energy and high power density, making it the top choice of power supply products for fields of portable electronic devices (PED) such as cell phones and tablets, power tools, electric vehicles (EVs), energy storage systems (ESS), space applications, military applications, and railways. Electric vehicles include hybrid electric vehicles (HEVs), plug-in hybrid electric vehicles (PHEVs), and pure battery electric vehicles (BEVs). If EVs replace the majority of fossil fuel (e.g., gasoline, diesel fuel, etc.) powered transportation, lithium-ion secondary batteries will significantly reduce greenhouse gas emissions. Moreover, the high energy efficiency of the lithium-ion secondary batteries may allow their use in various electric grid applications and improve the quality of energy harvested from wind, solar, geo-thermal and other renewable resources, thereby conducing to widely build an energy-sustainable society.

Therefore, commercial ventures as well as government and academic laboratories all conduct basic research of lithium-ion secondary batteries with intense interest. Although research and development in this field has abounded in recent years and lithium-ion secondary batteries are currently commercial, there remains a need for improvements of cycle lives of the lithium-ion secondary batteries which make them more applicable in various fields.

Lithium-ion secondary batteries rely on the lithium ions to travel back and forth between the positive and negative electrodes for completing the charging and discharging. Lithium-ion secondary batteries typically include a negative electrode current collector of a metal foil which is deposited with a negative electrode active material thereon. Copper foils are especially suitable for use as the negative electrode current collector because copper has a good electrical conductivity. Additionally, in order to increase the capacity of the lithium-ion secondary battery, substances such as silicon (Si), germanium (Ge), and tin (Sn) are mixed with the high-capacity active substances and filled in a lithium-ion secondary battery, intensifying the expansion and contraction of the active substances and increasing the stresses on the copper foil with which the active material is in contact. Furthermore, in some recent improved products, in order to increase the capacity of the lithium-ion secondary battery, the copper foil for electrodes is folded or bent and wound. If the copper foil cracks because it cannot withstand the expansion and contraction of the active substances during using the battery or it cannot withstand folding and winding during the manufacturing process of the lithium-ion secondary battery, the cycle characteristics of the lithium-ion secondary battery are adversely affected. As a result, there still remains a demand to improve the characteristics and properties of the copper foils and to enhance the performance of the lithium-ion secondary batteries. For example, the problems of failure resulting from the separation between copper foils and active materials or fractures of the copper foil under high cycles of charge and discharge and eventually shortening of the charge-discharge cycle life of the lithium-ion secondary battery still need to be solved.

SUMMARY OF THE DISCLOSURE

In view of this, an objective of the instant disclosure is to improve the charge-discharge cycle life performance of the lithium-ion secondary battery. To achieve the foresaid objective, in a first aspect, the instant disclosure provides an electrodeposited copper foil comprising a deposited side and a drum side opposite the deposited side, wherein the deposited side and the drum side each possess a residual stress (RS), and the electrodeposited copper foil has the following characteristics that:
- (a) an absolute value of a difference in the residual stress between the deposited side and the drum side, also abbreviated as a difference value which is represented by $\Delta RS$ below, is at most about 95 megapascals (MPa); and
- (b) the deposited side exhibits a void volume (Vv) in a range from about 0.15 cubic micrometer per square micrometer ($\mu m^3/\mu m^2$) to about 1.35 $\mu m^3/\mu m^2$.

In accordance with the instant disclosure, the deposited side and the drum side of the electrodeposited copper foil of the first aspect are directed to two opposite outermost sides of the electrodeposited copper foil, i.e., the deposited side and the drum side are located at the outermost sides of the electrodeposited copper foil. With appropriate $\Delta RS$ and Vv of the deposited side, the electrodeposited copper foil of the instant disclosure has excellent quality, which makes it suitable as a current collector. Thus, the electrodeposited copper foil can improve the performance and extend the charge-discharge cycle life when it is used for the lithium-ion secondary battery.

To achieve the foresaid objective, in a second aspect, the instant disclosure provides an electrodeposited copper foil comprising a deposited side and a drum side opposite the deposited side, wherein the electrodeposited copper foil has the following characteristics that:
- (a) the deposited side has a Kurtosis (Sku) in a range from about 1.5 to about 6.5; and
- (b) the deposited side exhibits a Vv in a range from about 0.15 $\mu m^3/\mu m^2$ to about 1.35 $\mu m^3/\mu m^2$.

As stated above, the deposited side and the drum side of the electrodeposited copper foil of the second aspect are directed to two opposite outermost sides of the electrodeposited copper foil. With appropriate Sku as well as Vv of the deposited side, the electrodeposited copper foil of the instant disclosure also has excellent quality, which makes it suitable as a current collector. Thus, the electrodeposited copper foil can improve the performance and extend the charge-discharge cycle life when it is used for the lithium-ion secondary battery.

As used herein, the "residual stress" is the stress present inside an object, a component, or a structure after all external applied forces have been removed. When the residual stress is a compressive stress, the residual stress is negative, and the value is denoted with a negative sign "−" before the value. When the residual stress is a tensile stress, the residual stress is positive, and a positive sign "+" may be optionally used before the value.

Optionally, ΔRS of the electrodeposited copper foil may be in a range from about 5 MPa to about 95 MPa. It is to be understood that the aforementioned range is continuous and may be represented as any of the following values (whose units are MPa): 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, but it is not limited thereto. Each of the above values can represent an endpoint in another range of values.

In some embodiments, reducing the ΔRS of the electrodeposited copper foil is beneficial to extend the charge-discharge cycle life of a lithium-ion secondary battery incorporating such electrodeposited copper foil. That is, a lithium-ion secondary battery comprising an electrodeposited copper foil of a larger ΔRS will have a shorter useful lifetime than a lithium-ion secondary battery comprising an electrodeposited copper foil of a smaller ΔRS. If ΔRS is too large, for example, greater than 95 MPa, the electrodeposited copper foil with excessive difference in residual stress between the deposited side and the drum side of the electrodeposited copper foil can be more easily broken than if ΔRS is smaller than 95 MPa. That is, the battery performance will be impacted negatively if the ΔRS of the electrodeposited copper foil is too high due to failure of the electrodeposited copper foil caused by excessive expansion or contraction during charge-discharge cycles. Therefore, if ΔRS of the electrodeposited copper foil is too large, the cycle life of the lithium-ion secondary battery is shortened because the electrodeposited copper foil is easily broken due to excessive expansion or contraction during the charge-discharge cycling test thereof.

In some embodiments, ΔRS of the electrodeposited copper foil is minimized as much as possible. Optionally, the ΔRS of the electrodeposited copper foil is at most about 85 MPa. Optionally, the ΔRS of the electrodeposited copper foil is at most about 81 MPa. Preferably, the ΔRS of the electrodeposited copper foil may be in a range from 5 MPa to about 60 MPa. The electrodeposited copper foil can improve the charge-discharge cycle life to 950 times or more when it is applied to a lithium-ion secondary battery. More preferably, the ΔRS of the electrodeposited copper foil may be in a range from about 5 MPa to about 50 MPa, such that the electrodeposited copper foil can improve the charge-discharge cycle life to 1000 times or more when it is applied to a lithium-ion secondary battery. Further more preferably, the ΔRS of the electrodeposited copper foil may be in a range from about 5 MPa to about 20 MPa, such that a lithium-ion secondary battery comprising the electrodeposited copper foil can possess a charge-discharge cycle life of 1200 times or more.

Optionally, the residual stress of the deposited side is basically larger than the residual stress of the drum side of the electrodeposited copper foil. Optionally, the residual stress of the deposited side of the electrodeposited copper foil may be about −40 MPa to about 100 MPa. Optionally, the residual stress of the drum side of the electrodeposited copper foil may be about −47 MPa to about 42 MPa.

As used herein, "void volume" is calculated by integrating an area enclosed by an areal material ratio curve at the height of a specified material ratio (mr), wherein the areal material ratio curve is obtained based on the Standard Method ISO 25178-2:2012. The Vv represents the total volume of voids per unit area on a certain side of the electrodeposited copper foil. With reference to the left side of FIG. 1, it shows a three-dimensional surface of the deposited side or the drum side of an electrodeposited copper foil. A corresponding areal material ratio curve can be drawn correspondingly and is as shown at the right side of FIG. 1. The top of the highest peak is set as a mr of 0%, and the bottom of the lowest valley is set as mr of 100%. The Vv is calculated by integrating the volume of the voids enclosed below a certain horizontal cutting plane (its height corresponding to a specified material ratio between 0% and 100%) and above all of the bottom of the valleys. For example, when the mr is at 100%, the corresponding Vv is zero; in contrast, when the mr is at 0%, the corresponding Vv is the maximum. Unless otherwise specified, the Vv listed herein refers to the void volume with the mr of 10%, which is the area indicated as Vv in FIG. 1.

With reference to FIG. 2, the relationship of different kinds of void volume parameters is illustrated. The core void volume (Vvc) is the difference in void volume between a first material ratio (mr1) and a second material ratio (mr2). Unless otherwise specified, Vvc listed herein is the difference in void volume between the first material ratio of 10% and the second material ratio of 80%; that is, the area is indicated as Vvc in FIG. 2. In addition, the dale void volume, which is also called valley void volume (Vvv), is the void volume at the second material ratio. Unless otherwise specified, Vvv listed herein is the void volume at mr of 80%; that is, the area is indicated as Vvv in FIG. 2. In other words, the Vv is the sum of the Vvc and Vvv.

In accordance with the instant disclosure, the deposited side of the electrodeposited copper foil may exhibit a Vv in the range from about 0.15 $\mu m^3/\mu m^2$ to 1.35 $\mu m^3/\mu m^2$, and the drum side of the electrodeposited copper foil may exhibit a Vv in the range from about 0.15 $\mu m^3/\mu m^2$ to about 1.35 $\mu m^3/\mu m^2$. In other words, the Vv falling within the range from about 0.15 $\mu m^3/\mu m^2$ to about 1.35 $\mu m^3/\mu m^2$ may be the Vv of the deposited side of the electrodeposited copper foil or the Vv of the drum side of the electrodeposited copper foil. The Vv of the deposited and the drum sides may be independently values. It is to be understood that the aforementioned ranges are continuous and could be represented as any of the following values (units of the following values are $\mu m^3/\mu m^2$): 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39, 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, 1.00, 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, 1.30, 1.31, 1.32, 1.33, 1.34, 1.35, but it is not limited thereto. Each of the above values can represent an endpoint in another range of values.

In some embodiments, the electrodeposited copper foil may have a Vv in a controlled range within specific upper and lower limits, for example, within a lower limit of 0.15 μm³/μm² and an upper limit of 1.35 μm³/μm². When Vv is too small, such as less than 0.15 μm³/μm², the adhesion of the copper foil to the active material is poor due to too weak anchor effect. That is, the active material cannot anchor to the side of the electrodeposited copper foil very well, and thus the adhesion strength is insufficient.

Conversely, if the Vv is too high, such as above 1.35 mm³/μm², a high Vv indicates larger void volume on the side of the electrodeposited copper foil, the active material cannot be coated uniformly on the side of the electrodeposited copper foil and cannot fill all of these voids, leaving some uncovered and covered voids that remain between the electrodeposited copper foil and the active material. Consequently, when the Vv is too high or too low, the adhesion of the electrodeposited copper foil and the active material is poor; that is, the lithium-ion secondary batteries made with the aforesaid electrodeposited copper foils not having Vv in the appropriate range will exhibit shorter charge-discharge cycle lives and poorer battery performance.

Optionally, the deposited side and the drum side of the electrodeposited copper foil may each independently exhibit a Vv in the range from about 0.15 μm³/μm² to 1.30 μm³/μm². Optionally, the deposited side and the drum side of the electrodeposited copper foil may each independently exhibit a Vv in the range from about 0.16 μm³/μm² to 1.18 μm³/μm². In one of embodiments, the deposited side and the drum side of the electrodeposited copper foil may each independently exhibit a Vv in the range from about 0.17 μm³/μm² to 1.11 μm³/μm². In another embodiment, the deposited side and the drum side of the electrodeposited copper foil may each independently exhibit a Vv in the range from about 0.25 μm³/μm² to 1.00 μm³/μm².

For the deposited side of the electrodeposited copper foil, the Vvc may be in the range from 0.14 μm³/μm² to 1.15 μm³/μm². Optionally, the deposited side of the electrodeposited copper foil may exhibit a Vvc in the range from 0.15 μm³/μm² to 1.10 μm³/μm². Optionally, the deposited side of the electrodeposited copper foil may exhibit a Vvv at most about 0.15 μm³/μm². Specifically, the deposited side of the electrodeposited copper foil may exhibit a Vvv in the range from about 0.01 μm³/μm² to about 0.15 μm³/μm² or in the range from about 0.01 μm³/μm² to about 0.10 μm³/μm².

For the drum side of the electrodeposited copper foil, the Vvc may be in the range from 0.14 μm³/μm² to 1.15 μm³/μm². Optionally, the drum side of the electrodeposited copper foil may exhibit a Vvc in the range from 0.15 μm³/μm² to 1.10 μm³/μm². Optionally, the drum side of the electrodeposited copper foil may exhibit a Vvc in the range from 0.15 μm³/μm² to 0.75 μm³/μm². Optionally, the drum side of the electrodeposited copper foil may exhibit a Vvv at most about 0.15 μm³/μm². Specifically, the drum side of the electrodeposited copper foil may exhibit a Vvv in the range from about 0.01 μm³/μm² to about 0.15 μm³/μm², in the range from about 0.01 μm³/μm² to about 0.10 μm³/μm², or in the range from about 0.01 μm³/μm² to about 0.05 μm³/μm².

As used herein, "Kurtosis" is a yardstick for determining the sharpness of the height distribution of a surface according to the Standard Method ISO 25178-2: 2012. The lower Sku represents the height distribution of the surface is flatter; in contrast, the higher Sku represents the sharpness of the peaks or valleys of the surface are higher, which means there are more steep peaks and valleys.

The Sku falling within the range from about 1.5 to about 6.5 may be the Sku of the deposited side of the electrodeposited copper foil or the Sku of the drum side of the electrodeposited copper foil. In other words, in addition to controlling the Sku of the deposited side of the electrodeposited copper foil, the Sku of the deposited side and the Sku of the drum side of the electrodeposited copper foil can be both controlled. The Sku of the deposited side and the Sku of the drum side may be independent values. It is to be understood that the aforementioned ranges are continuous and could be represented as any of the following values: 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5, 5.6, 5.7, 5.8, 5.9, 6.0, 6.1, 6.2, 6.3, 6.4, 6.5, but it is not limited thereto. Each of the above values can represent an endpoint in another range of values.

In some embodiments, controlling the Sku of the deposited side and/or the drum side of the electrodeposited copper foil is also beneficial to extend the charge-discharge cycle life of a lithium-ion secondary battery incorporating such electrodeposited copper foil. If the Sku of the deposited side and/or the drum side of the electrodeposited copper foil is too low, such as less than 1.5, or too high, such as more than 6.5, the adhesion of the active material and the deposited side and/or the drum side of the electrodeposited copper foil is poor. The battery produced by the electrodeposited copper foil failing to control the Sku within the appropriate range will have shorter charge-discharge cycle life and poor battery performance.

Optionally, the Sku of the deposited side and/or the Sku of the drum side of the electrodeposited copper foil may be independently in a range from 1.5 to 6.5. Optionally, the Sku of the deposited side and/or the Sku of the drum side of the electrodeposited copper foil may be independently in a range from 1.6 to 6.2. Optionally, the Sku of the deposited side and/or the Sku of the drum side of the electrodeposited copper foil may be independently in a range from 1.7 to 5.8. In one of the embodiments, the Sku of the deposited side and/or the Sku of the drum side of the electrodeposited copper foil may be independently in a range from 1.5 to 3.7. In another embodiment, the Sku of the deposited side and/or the Sku of the drum side of the electrodeposited copper foil may be independently in a range from 4.0 to 6.5.

Optionally, the electrodeposited copper foil may have a thickness of about 3 μm to about 20 μm, but is not limited thereto. It can be understood that one person skilled in the art can properly adjust the thickness of the electrodeposited copper foil according to different needs.

As used herein, the definitions of the deposited side and the drum side of the electrodeposited copper foil are related to their relative positions during the manufacturing process of the electrodeposited copper foil. In one of embodiments, the electrodeposited copper foil may be the bare copper foil produced after the electrodeposition step, which is a bare copper foil without any surface treatment. During the electrodeposition step, the bare copper foil may be prepared by using a copper electrolyte solution comprising copper sulfate and sulfuric acid as main components, a titanium plate coated by iridium-containing components or iridium oxides as a dimensionally stable anode (DSA), and a titanium drum as a cathode drum, applying a direct current between these two electrodes to electrodeposit the copper ions in the copper electrolyte solution on the titanium cathode drum, and then stripping and winding the bare copper foil from the titanium cathode drum. Herein, the side of the bare copper foil close to the copper electrolyte solution is called "deposited side" while the side of the bare copper foil close to the surface of the titanium cathode drum is called "drum side"; both of the deposited side and the drum side are the outermost sides of the electrodeposited copper foil. In another embodiment, the electrodeposited copper foil may be a copper foil that is processed with surface treatment after the electrodeposition step; that is, the electrodeposited copper foil comprises a bare copper foil and a surface-treated layer disposed on the bare copper foil, and the deposited side and the drum side are the outermost sides of the electrodeposited copper foil. In other words, for the electrodeposited copper foil that has the bare copper foil further processed with surface treatment, the deposited side and the drum side are both the outermost opposite sides of the electrodeposited copper foil.

Optionally, the surface-treated layer may be an anti-tarnish layer, but is not limited thereto. The anti-tarnish layer can protect the bare copper foil from degradation caused by, for example, corrosion. Optionally, the bare copper foil prepared after the electrodeposition step can immerse into or pass through a solution containing an anti-tarnish material and undergo electroplating to form the anti-tarnish layer thereon. For example, the anti-tarnish material comprises zinc (Zn), chromium (Cr), nickel (Ni), cobalt (Co), molybdenum (Mo), vanadium (V) or any combinations thereof; or, the anti-tarnish material may comprise an organic compound such as azole compound. The surface treatment can be continuous and part of the overall process in preparing the electrodeposited copper foil.

To achieve the foresaid objective, in a third aspect, the instant disclosure provides a current collector comprising the foresaid electrodeposited copper foil. As stated in the first or second aspect, the electrodeposited copper foil having said two characteristics, such as having properly controlled $\Delta RS$ and $Vv$ of the deposited side or having properly controlled $Sku$ and $Vv$ of the deposited side, the electrodeposited copper foils in the first and second aspects are suitable for current collectors.

Optionally, the current collector can be used as a negative electrode current collector or a positive electrode current collector.

To achieve the foresaid objective, in a fourth aspect, the instant disclosure provides an electrode, which comprises the foresaid current collector and an active substance, and the active substance may be coated on the current collector.

Optionally, the active material may be positive electrode active substance or a negative electrode active substance. In one of the embodiments, the positive electrode active substance may be coated on the side of the electrodeposited copper foil to prepare a positive electrode. In another embodiment, the negative electrode active substance may be coated on the side of the electrodeposited copper foil to prepare a negative electrode.

The negative electrode active substance may be a carbon-containing substance, a silicon-containing substance, a silicon carbide composite, a metal, a metal oxide, a metal alloy, or a polymer. The carbon-containing substance or the silicon-containing substance is preferable, but it is not limited thereto. Specifically, the carbon-containing substance may be, but is not limited to, a non-graphitizing carbon, a coke, a graphite, a glasslike carbon, a carbon fiber, an activated carbon, a carbon black or a high polymer calcined substance. The coke may comprise pitch coke, needle coke or petroleum coke, etc. The high polymer calcined substance may be obtained by calcining a phenol-formaldehyde resin or a furan resin at a suitable temperature for carbonation. The silicon-containing substance has an excellent ability to form an alloy with lithium ions and an excellent ability to extract lithium ions from the lithium alloy. When the silicon-containing substance is applied to a lithium-ion secondary cell, a high energy density secondary cell can be obtained. The silicon-containing substance may be combined with cobalt (Co), nickel (Ni), zinc (Zn), chromium (Cr), molybdenum (Mo), iron (Fe), tin (Sn), copper (Cu), manganese (Mn), indium (In), silver (Ag), titanium (Ti), germanium (Ge), bismuth (Bi), antimony (Sb), ruthenium (Ru), or combinations thereof to form an alloy. The element of the metal or metal alloy may be selected from the group consisting of Co, Fe, Sn, Ni, Cu, Mn, Zn, In, Ag, Ti, Ge, Bi, Sb, Cr, Ru, and Mo, but it is not limited thereto. The aforesaid metal oxide may be, but is not limited to, ferric oxide, ferric ferrous oxide, ruthenium dioxide, molybdenum dioxide and molybdenum trioxide. The examples of the aforesaid polymers may include, but are not limited to, polyacetylene and polypyrrole. Optionally, the positive electrode active substance may have multiple choices. Depending on the difference of the positive electrode active substances, the lithium-ion secondary battery may be $LiCoO_2$ secondary battery, $LiNiO_2$ secondary battery, $LiMn_2O_4$ secondary battery, and $LiFePO_4$ secondary battery, etc., but it is not limited thereto.

To achieve the foresaid objective, in a fifth aspect, the instant disclosure provides a lithium-ion secondary battery, which comprises the foresaid electrode. Specifically, the lithium-ion secondary battery comprises a positive electrode, a negative electrode, and an electrolyte solution.

Optionally, the electrodeposited copper foil in the first or second aspect is particularly suitable for the preparation of the negative electrode of the lithium-ion secondary battery. With at least two foresaid characteristics, for example, properly controlled $\Delta RS$ and $Vv$ of the deposited side or properly controlled $Sku$ and $Vv$ of the deposited side, the electrodeposited copper foil of the first or second aspect can have excellent workability, durability, low wrinkling and low cracking, which contribute to the improvement of the adhesion of the electrodeposited copper foil in contact with the active material and the prevention of the failure resulting from separation that the active materials are detached from the electrodeposited copper foils or fractures of the electrodeposited copper foil after the lithium-ion secondary battery undergoes high cycles of charge and discharge. In short, the electrodeposited copper foil of the first or second aspect can significantly improve the performance of the lithium-ion secondary battery, and allows the lithium-ion secondary battery comprising such electrodeposited copper foil to at least exhibit a charge-discharge cycle life of 900 times to 1200 times or more. Therefore, the lithium-ion secondary battery has excellent useful lifetime performance.

In accordance with the instant disclosure, the electrolyte solution may comprise solvent, electrolyte or additives added depending on different conditions. The solvent of the electrolyte solution may comprise a non-aqueous solvent, for example, a cyclic carbonate such as ethylene carbonate (EC) or propylene carbonate (PC); a linear carbonate such as dimethyl carbonate (DMC), diethyl carbonate (DEC), or ethyl methyl carbonate (EMC); or sultone, but it is not limited thereto. The foresaid solvent may be used alone or in combination of two or more kinds of solvents.

In some embodiments, the positive electrode and the negative electrode of the lithium-ion secondary battery can be separated by a separator film. In some embodiments, the electrodeposited copper foil can be used to prepare a lithium-ion secondary battery, such as laminated type lithium-ion secondary battery or coin type lithium-ion secondary battery, but is not limited thereto.

In other aspects, the instant disclosure can provide a device comprising a lithium-ion secondary battery. Herein, the device comprises items or components requiring electric power for its operation. For example, lightweight, portable, independent, and movable components and devices all require small and light batteries. The devices may comprise vehicles (e.g., automobiles, streetcars, buses, trucks, boats, submarines, airplanes), computers (e.g., for microcontrollers, laptops, tablets), phones (e.g., smart phones, wireless landlines), personal health monitoring equipment (e.g., glucose monitors, pacemakers), power tools (e.g., electric drills, chainsaws), illuminators (e.g., flashlights, emergency lighting, signs), hand-held measuring devices (e.g., pH meters, air monitoring devices) and habitation units (e.g., in a spaceship, in a trailer, in a house, in a plane, or in a submarine), but are not limited thereto. Also, the electrodeposited copper foil of the instance disclosure can be applied to lightweight lithium-ion secondary batteries, making it suitable to be used in electric vehicles, portable electronic devices, and space products, etc.

DETAILED DESCRIPTION OF THE DISCLOSURE

Figure 1:
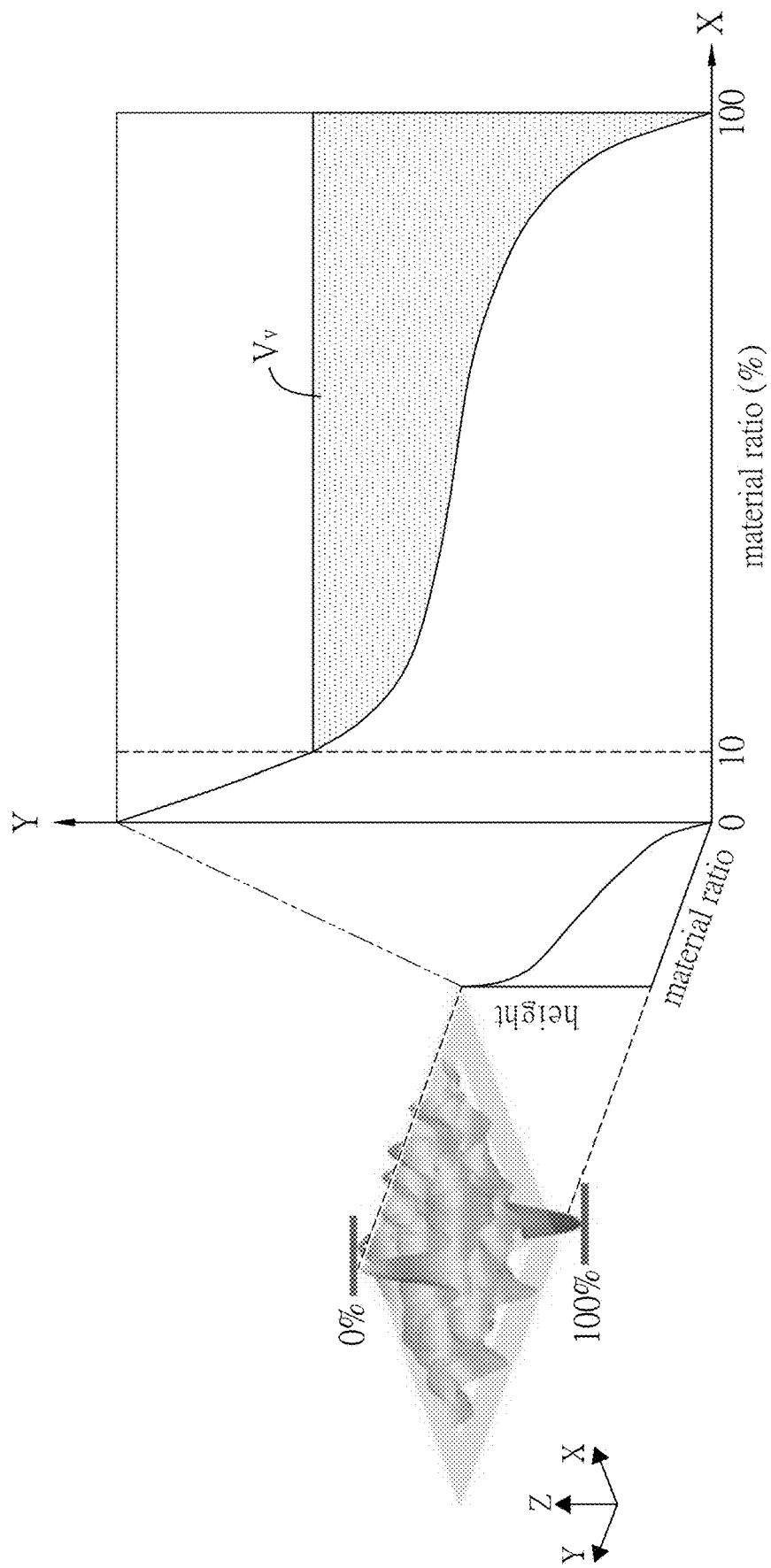
FIG. 1 illustrates an areal material ratio plot drawn corresponding to the 3D structure of a surface.
Figure 2:
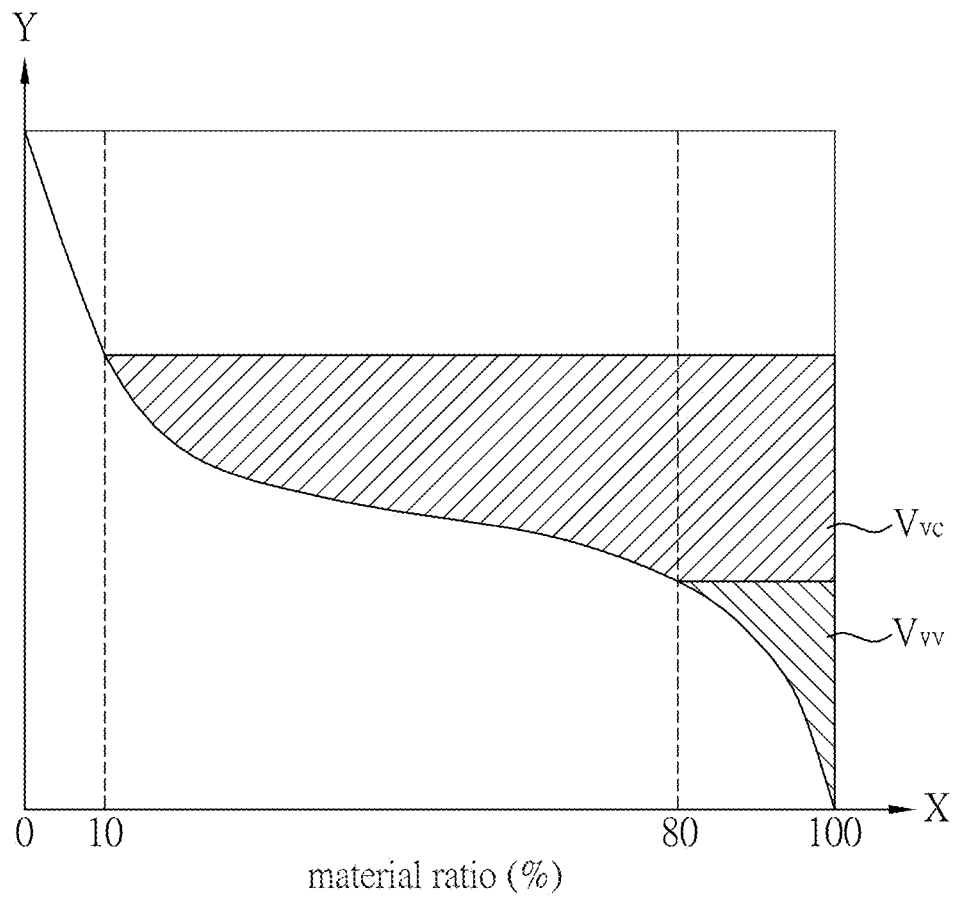
FIG. 2 is an areal material ratio plot illustrating the relationship of Vv, Vvc, and Vvv.

Hereinafter, several examples are described to illustrate the embodiments of an electrodeposited copper foil, a current collector, an electrode, and a lithium-ion secondary battery of the instant disclosure, and several comparative examples are provided for comparison. From comparison of the following examples and comparative examples, one person skilled in the art can easily realize that the electrodeposited copper foil of each example used as a current collector can exhibit good performance because it has small difference value in residual stress between the deposited side and the drum side as well as properly controlled Vv or has properly controlled Sku and Vv. The good performance is that, for example, the active substance can adhere to the electrodeposited copper foil of each of the examples well and is used to prepare a negative electrode of the lithium-ion secondary battery to provide a good charge-discharge cycle life performance.

It should be understood that the descriptions proposed herein are just for the purpose of illustrations only, not intended to limit the scope of the disclosure. Various modifications and variations could be made in order to practice or apply the instant disclosure without departing from the spirit and scope of the instant disclosure.

〈Electrodeposited Copper Foil〉

Examples 1 to 5 (E1 to E5) and Comparative Examples 1 to 5 (C1 to C5): Electrodeposited Copper Foils The system for preparing electrodeposited copper foils comprises a metal cathode drum and an insoluble metal anode. The metal cathode drum is rotatable and has a polished surface. In this system, the insoluble metal anode approximately surrounds the lower half of the metal cathode drum. The cathode drum and the anode plate are spaced apart from each other and allow the copper electrolyte solution to be introduced through the feed pipe. The surface treatment device comprises an anti-tarnish treatment tank and electrode plates disposed therein. In addition, the system further comprises multiple guide rollers for transporting a bare copper foil, an anti-tarnish treated copper foil, and an end product, and finally the electrodeposited copper foil is wound on the guide roller. During the process that the electrodeposited copper foil is manufactured by using continuous electrodeposition, a copper electrolyte solution was fed between a titanium plate coated by iridium-containing components or iridium oxides as insoluble anode and titanium cathode drum and a direct current was applied between these two electrodes to allow the copper ions in the copper electrolyte solution continuously to be electrodeposited on the titanium cathode drum, and then the bare copper foil was detached and wound from the guide roller when a predetermined thickness was obtained. After the bare copper foil of the predetermined thickness was obtained, the bare copper foil was transported and immersed in the anti-tarnish treatment tank filled with an anti-tarnish solution by the guide roller to undergo an anti-tarnish treatment, and continuous electroplating was applied to the two sides of the bare copper foil by using the electrode plates, so as to form two surface-treated layers (i.e., anti-tarnish layers) respectively adhered onto the two sides of the bare copper foil.

The conditions for manufacturing the electrodeposited copper foil are described as follows:

(1) Composition of the Copper Electrolyte Solution:

Copper sulfate ($CuSO_4 \cdot 5H_2O$): about 280 grams per liter (g/L);

Sulfuric acid with a concentration of 50 wt. %: about 80 g/L;

Chloride ion (derived from HCl, purchased from RCI Labscan Ltd.): about 30 mg/L;

Polyethylenimine (abbreviated as PEI, linear, which has a number average molecular weight (Mn)=5000, purchased from Sigma-Aldrich Company): about 4.0 mg/L to 17 mg/L; and Saccharin (1,1-dioxo-1,2-benzothiazol-3-one, purchased from Sigma-Aldrich Company): about 2.3 mg/L to 8.3 mg/L.

(2) Parameters of Manufacturing the Bare Copper Foil:

Temperature of the copper electrolyte solution: about 45° C.; and

Current density: about 40 amperes per square decimeter ($A/dm^2$).

(3) Composition of the Anti-Tarnish Solution:

Chromic acid ($CrO_3$, purchased from Sigma-Aldrich Company): about 1.5 g/L.

(4) Parameters for Anti-Tarnish Treatment:

Temperature of the anti-tarnish solution: about 25° C.;

Current density: about 0.5 $A/dm^2$; and

Processing time: about 2 seconds.

Finally, the anti-tarnish treated copper foil was passed through an air knife to remove excess anti-tarnish layer and dry, and the electrodeposited copper foil having a thickness of about 6 micrometers (μm) was then wound on the guide roller.

The differences among the manufacturing processes of the electrodeposited copper foils of Examples 1 to 5 and Comparative Examples 1 to 5 were the amounts of PEI and saccharin in the copper electrolyte solution, and the parameters were listed in Table 1 below.

It should be noted that the aforesaid method for manufacturing the electrodeposited copper foil is illustrative only for the manner of obtaining the electrodeposited copper foil in the instant disclosure, but the electrodeposited copper foil in the instant disclosure, such as Examples 1 to 5, is not limited to that the electrodeposited copper foil needs to be manufactured by the aforesaid method.

It should be noted that regardless of whether the bare copper foil is processed with surface treatment after the electrodeposition step, two outermost opposite sides of the electrodeposited copper foil used herein are defined by the relative positions between the bare copper foil and the titanium cathode drum and between the bare copper foil and the copper electrolyte solution during the electrodeposition step. In one of the embodiments, for the manufacturing process in which no surface treatment is performed after the electrodeposition step, the electrodeposited copper foil is the bare copper foil wound after the electrodeposition step, a side of the bare copper foil near the copper electrolyte solution is called "deposited side", the other side of the bare copper foil near the titanium cathode drum is called "drum side", and the drum side and the deposited side are located at the outermost sides of the electrodeposited copper foil. In another embodiment, for the manufacturing process in which a surface treatment is performed on a single side of the bare copper foil after the electrodeposition step, the electrodeposited copper foil comprises a bare copper foil and a surface-treated layer on the bare copper foil. Taking the surface treatment processed on a single side of the bare copper foil near the titanium cathode drum as an example for illustration, "drum side" is the outer side of the surface-treated layer which is opposite a side of the bare copper foil, and "deposited side" is the side of the bare copper foil near the copper electrolyte solution during the electrodeposition, and the deposited side and the drum side are located at the outermost sides of the electrodeposited copper foil. In further another embodiment, for the manufacturing process in which a surface treatment is performed on double sides of the bare copper foil after the electrodeposition step, the electrodeposited copper foil comprises a bare copper foil and two surface-treated layers on the bare copper foil. In this case, "deposited side" is the outer side of one of the surface-treated layers, and it is opposite to a side of the bare copper foil near the copper electrolyte solution during electrodeposition, and "drum side" is the outer side of another surface-treated layer, and it is opposite to the other side of the bare copper foil near the titanium cathode drum during electrodeposition. Herein, the deposited side and the drum side are both located at the outermost sides of the electrodeposited copper foil.

TABLE 1 amounts of PEI and saccharin in the copper electrolyte solution of Examples 1 to 5 and Comparative Examples 1 to 5.

| | Amount of PEI (mg/L) | Amount of Saccharin (mg/L) |
|---|---|---|
| Example 1 (E1) | 13 | 5.3 |
| Example 2 (E2) | 9.5 | 5.3 |
| Example 3 (E3) | 9.5 | 6.8 |
| Example 4 (E4) | 9.5 | 3.8 |
| Example 5 (E5) | 6 | 5.3 |
| Comparative Example 1 (C1) | 14.5 | 5.3 |
| Comparative Example 2 (C2) | 9.5 | 8.3 |
| Comparative Example 3 (C3) | 9.5 | 2.3 |
| Comparative Example 4 (C4) | 4 | 5.3 |
| Comparative Example 5 (C5) | 17 | 3 |

Test Example 1: Surface Texture Analysis

Surface texture of each of the electrodeposited copper foils of Examples 1 to 5 and Comparative Examples 1 to 5 was observed by a laser microscope, and the respective resulting image was captured. Moreover, the respective Vv, Vvc, Vvv, and Sku of the deposited side and the drum side of the electrodeposited copper foil of each of Examples 1 to 5 and Comparative Examples 1 to 5 were analyzed in accordance with the Standard Method of ISO 25178-2: 2012, and the results were listed in Tables 2 and 3.

Herein, the instruments and condition of the surface texture analysis were described as follows:

(1) Instruments:

Laser microscope: LEXT OLS5000-SAF, manufactured by Olympus; and

Objective lenses: MPLAPON-100×LEXT.

(2) Analysis Conditions:

Wavelength of light source: 405 nm;

Objective lens magnification: 100× magnification;

Optical zoom: 1.0×;

Resolution: 1024 pixels×1024 pixels;

Image area: 129 μm×129 μm;

Condition: auto tilt removal;

Filter: no filter;

Temperature: 24±3° C.; and

Relative humidity: 63±3%.

Vv was the sum of the Vvc and Vvv, and its unit is $\mu m^3/\mu m^2$. The Vv was the void volume calculated with a material ratio of 10%, Vvv was the void volume calculated with a material ratio of 80%, and Vvc was a difference in the void volume between the material ratios of 10% and 80%.

TABLE 2

Vvc, Vvv, and Vv of the electrodeposited copper foils of E1 to E5 and C1 to C5.

| | Electrodeposited Copper Foil | | | | | |
|---|---|---|---|---|---|---|
| | Vvc ($\mu m^3/\mu m^2$) | | Vvv ($\mu m^3/\mu m^2$) | | Vv ($\mu m^3/\mu m^2$) | |
| Characteristics Target | Deposited Side | Drum Side | Deposited Side | Drum Side | Deposited Side | Drum Side |
| E1 | 0.16 | 0.59 | 0.01 | 0.03 | 0.17 | 0.62 |
| E2 | 0.68 | 0.60 | 0.10 | 0.02 | 0.78 | 0.62 |
| E3 | 0.21 | 0.59 | 0.10 | 0.03 | 0.31 | 0.62 |
| E4 | 0.98 | 0.58 | 0.05 | 0.04 | 1.03 | 0.62 |
| E5 | 1.07 | 0.59 | 0.04 | 0.03 | 1.11 | 0.62 |
| C1 | 0.06 | 0.60 | 0.01 | 0.03 | 0.07 | 0.63 |
| C2 | 0.08 | 0.60 | 0.01 | 0.02 | 0.09 | 0.62 |
| C3 | 1.31 | 0.58 | 0.34 | 0.04 | 1.65 | 0.62 |
| C4 | 1.27 | 0.59 | 0.21 | 0.04 | 1.48 | 0.63 |
| C5 | 0.82 | 0.60 | 0.09 | 0.02 | 0.91 | 0.62 |

Test Example 2: Residual Stress

In the instant test example, the residual stress of the deposited sides and the drum sides of the electrodeposited copper foils of Examples 1 to 5 and Comparative Examples 1 to 5 was measured by using an X-ray apparatus, and the results were listed in Table 3.

Herein, the instruments and conditions of the residual stress analysis were described as follows:

(1) Instruments:

X-ray apparatus: Empyrean, manufactured by PANalytical;

X-ray tube: copper target ($\lambda$=1.54184 Å);

Mirror in the incident beam: X-ray hybrid mirror;

Collimator in the diffracted beam: 0.27 parallel plate collimator; and

Detector: proportional counter.

(2) Conditions:

Tube voltage: 45 kV;

Tube current: 20 mA; and

Grazing incidence angle: 1°.

In Table 3 below, the difference value of the residual stress is directed to the absolute value of the difference in residual stress between the deposited side and the drum side ($\Delta$RS). Because the residual stress of the deposited side of the electrodeposited copper foil is larger than that of the drum side, the difference value between both sides is just the same with the difference calculated by subtracting the residual stress of the drum side from the residual stress of the deposited side.

〈Electrode〉

Examples 1A to 5A and Comparative Examples 1A to 5A: Negative Electrodes

The foresaid electrodeposited copper foil of Examples 1 to 5 and Comparative Examples 1 to 5 could be used as current collectors. The two outermost opposite sides of each electrodeposited copper foil (i.e., the foresaid drum side and deposited side) could be further coated with a negative electrode slurry containing negative electrode active substances to prepare a negative electrode for a lithium-ion secondary battery.

Specifically, the negative electrode could be substantially prepared by the following steps.

Firstly, at a solid-liquid ratio of 100:60, 100 g of negative electrode active material was mixed with 60 g of a solvent (N-methylpyrrolidone (NMP)) to prepare the negative electrode slurry. Herein, the composition of the negative electrode active material (the content of each component was based on the entire negative electrode active material as 100 wt. %) was described as follows: 93.9 wt. % of negative electrode active substances (mesophase graphite powders, MGP);

1 wt. % of conductive additive (conductive carbon black powders, Super P®);

5 wt. % of a solvent binder (polyvinylidene fluoride, PVDF 6020); and 0.1 wt. % of oxalic acid.

Next, the negative electrode slurry was coated on the deposited side and the drum side of the electrodeposited copper foil, then pressed and cut into a suitable size after the solvent evaporation, and a negative electrode was obtained. Accordingly, the negative electrodes of Examples 1A to 5A and Comparative Examples 1A to 5A could be respectively prepared by using the electrodeposited copper foils of Examples 1 to 5 and Comparative Examples 1 to 5 through the foresaid method.

〈Lithium-ion Secondary Battery〉

Examples 1B to 5B and Comparative Examples 1B to 5B: Lithium-Ion Secondary Batteries The aforesaid negative electrodes of Examples 1A to 5A and Comparative Examples 1A to 5A could be further associated with the positive electrodes to respectively prepare the lithium-ion secondary batteries of Examples 1B to 5B and Comparative Examples 1B to 5B.

Specifically, the positive electrode for the lithium-ion secondary battery could be substantially prepared by the following steps.

First, at a solid-liquid ratio of 100:195, 100 g of the positive electrode active material was mixed with 195 g of NMP to prepare a positive electrode slurry. Herein, the composition of the positive electrode active material (the content of each component was based on the entire positive electrode active material as 100 wt. %) was described as follows:

89 wt. % of positive electrode active substance ($LiCoO_2$);

5 wt. % of conductive additive (flaked graphite, KS 6);

1 wt. % of conductive additive (conductive carbon black powders, Super P®); and 5 wt. % of polyvinylidene fluoride (PVDF 1300).

Next, the positive electrode slurry was coated on an aluminum foil, and after the solvent was evaporated, the positive electrodes and the negative electrodes were cut into a specific size, and then the positive electrodes and the negative electrodes were alternately stacked with a microporous separator (manufactured by Celgard Co., Ltd.) sandwiched there between, and then placed in a pressing mold filled with the electrolyte solution, and sealed to form a lithium-ion secondary battery. The lithium-ion secondary battery was in a size of 41 mm×34 mm×53 mm.

Test Example 3: Charge-Discharge Cycle Life Performance

In the instant test example, the lithium-ion secondary batteries of the Examples 1B to 5B and Comparative Examples 1B to 5B, as the test samples, were subjected to charge-discharge cycling tests. The analysis conditions of the charge-discharge cycling test were as follows:

Charging mode: constant current-constant voltage (CCCV);

Discharging mode: constant current (CC);

Charging voltage: 4.2 Volts (V);

Charging current: 5 C;

Discharging voltage: 2.8 V;

Discharging current: 5 C;

Test temperature: about 55° C.

The charge-discharge cycle life of the lithium-ion secondary battery was defined as the number of charge and discharge cycles a lithium-ion secondary battery performed when the capacity dropped to 80% of its initial capacity after a series of cycles of charging and discharging. The results of the charge-discharge cycle life performance test of the lithium-ion secondary batteries of Examples 1B to 5B, which respectively comprise the electrodeposited copper foils of Examples 1 to 5 and Comparative Examples 1B to 5B, which respectively comprise the electrodeposited copper foils of Comparative Examples 1 to 5, were also shown in Table 3 below.

According to the aforesaid manufacturing method, the differences between the lithium-ion secondary batteries of Examples 1B to 5B and those of Comparative Examples 1B to 5B only came from the use of the electrodeposited copper foils used in the negative electrodes, so the charge-discharge cycle life performance of the lithium-ion secondary battery was mainly attributed to the characteristics of each electrodeposited copper foil.

TABLE 3 characteristics of the electrodeposited copper foils of E1 to E5 and C1 to C5 and their charge-discharge cycle lives when applied to the lithium-ion secondary batteries.

| Target | Electrodeposited Copper Foil | | | | | | | Battery Charge-Discharge Cycle Life |
|---|---|---|---|---|---|---|---|---|
| | Vv (μm³/μm²) | | Residual Stress (MPa) | | | Sku | | |
| | Deposited Side | Drum Side | Deposited Side | Drum Side | Difference Value | Deposited Side | Drum Side | (cycles) Overall |
| E1 | 0.17 | 0.62 | 98.8 | 6 | 92.8 | 5.8 | 5.5 | 926 |
| E2 | 0.78 | 0.62 | 54.4 | −5.2 | 59.6 | 3.7 | 3.4 | 997 |
| E3 | 0.31 | 0.62 | 82.5 | 41.8 | 40.7 | 4.2 | 4.2 | 1114 |
| E4 | 1.03 | 0.62 | 80.5 | −10.2 | 90.7 | 3.8 | 3.4 | 902 |
| E5 | 1.11 | 0.62 | −39.4 | −46.8 | 7.4 | 1.7 | 1.8 | 1224 |
| C1 | 0.07 | 0.63 | 102.5 | −3.2 | 105.7 | 6.9 | 6.6 | 815 |
| C2 | 0.09 | 0.62 | 86.2 | 38 | 48.2 | 3.8 | 3.8 | 803 |
| C3 | 1.65 | 0.62 | 66.8 | −36.1 | 102.9 | 3.5 | 3.6 | 658 |
| C4 | 1.48 | 0.63 | 1.8 | −10.6 | 12.4 | 0.9 | 0.9 | 681 |
| C5 | 0.91 | 0.62 | 107.5 | −2.4 | 109.9 | 8.2 | 7.8 | 788 |

(Discussion of Experimental Results)

As shown in Table 3, the electrodeposited copper foils of Examples 1 to 5 at least had two characteristics of the ΔRS at most 95 MPa and the Vv of the deposited side in the range from 0.15 μm³/μm² to 1.35 μm³/μm²; in contrast, the electrodeposited copper foils of Comparative Examples 1 to 5 failed to have both of these two characteristics. Comparing the performance of the electrodeposited copper foils of Examples 1 to 5 and Comparative Examples 1 to 5 applied to the lithium-ion secondary batteries, the charge-discharge cycle lives of the lithium-ion secondary batteries of Examples 1B to 5B could all reach 900 times or more, while the charge-discharge cycle lives of the lithium-ion secondary batteries of Comparative Examples 1B to 5B were at most 815 times. These experimental results demonstrated that controlling the ΔRS and the Vv of the deposited side of the electrodeposited copper foil is actually beneficial to extend the useful lifetime and improve the performance of the lithium-ion secondary battery comprising the same.

It is clear from the experimental results that both of the ΔRS and the Vv of the deposited side of the electrodeposited copper foil have significant influence on the charge-discharge cycle life of a lithium-ion secondary battery, and both are indispensable. That is, controlling the ΔRS and the Vv of the deposited side of the electrodeposited copper foil is actually beneficial to improve the performance of the lithium-ion secondary battery. In contrast, taking the electrodeposited copper foils of Comparative Examples 2 to 4 as examples, these electrodeposited copper foils had controlled the ΔRS but failed to suitably control the Vv of the deposited side, such that the performance of charge-discharge cycle lives of the lithium-ion secondary batteries of Comparative Examples 2B to 4B was unsatisfactory. Further, taking the electrodeposited copper foil of Comparative Example 5 as an example, the Vv of the deposited side was properly controlled but the ΔRS was not, such that the charge-discharge cycle life of the lithium-ion secondary battery of Comparative Example 5B could not reach 800 times.

Further analyzing the experimental results of the above Table 3 from another way, the electrodeposited copper foils of Examples 1 to 5 at least had two characteristics of the Sku of the deposited side in the range from 1.5 to 6.5 as well as the Vv of the deposited side in the range from 0.15 μm³/μm² to 1.35 μm³/μm²; in contrast, the electrodeposited copper foils of Comparative Examples 1 to 5 failed to have both of these two characteristics. From the comparison of the performance of the electrodeposited copper foils of Examples 1 to 5 and Comparative Examples 1 to 5 applied to the lithium-ion secondary batteries, the charge-discharge cycle lives of the lithium-ion secondary batteries of Examples 1B to 5B could all reach 900 times or more, while the charge-discharge cycle lives of the lithium-ion secondary batteries of Comparative Examples 1B to 5B were at most 815 times. It could be seen that controlling the Sku as well as the Vv of the deposited side of the electrodeposited copper foil is actually beneficial to extend the useful lifetime and improve the performance of the lithium-ion secondary battery comprising the same.

Both of the Sku and the Vv of the deposited side of the electrodeposited copper foil have significant influence on the charge-discharge cycle life of a lithium-ion secondary battery, and both are indispensable. That is, controlling the Sku as well as the Vv of the deposited side of the electrodeposited copper foil in suitable ranges is actually beneficial to improve the performance of the lithium-ion secondary battery. For example, the electrodeposited copper foils of Comparative Examples 2 and 3 had controlled the Sku of the deposited side but failed to suitably control the Vv of the deposited side, and thus the performance of charge-discharge cycle lives of the lithium-ion secondary batteries of Comparative Examples 2B and 3B were unsatisfactory. Further, taking the electrodeposited copper foil of Comparative Example 5 as an example, the Vv of the deposited side was properly controlled but the Sku of the deposited side was not, such that the charge-discharge cycle life of the lithium-ion secondary battery of Comparative Example 5B could not reach 800 times.

In addition to the foresaid two technical means for improving the electrodeposited copper foil (i.e., controlling both of the ΔRS and the Vv of the deposited side of the electrodeposited copper foil or controlling both of the Sku and the Vv of the deposited side of the electrodeposited copper foil), one person skilled in the art can control three characteristics of ΔRS, the Sku of the deposited side, and the Vv of the deposited side depending on conditions, so as to extend the charge-discharge cycle life of the lithium-ion secondary battery.

Moreover, analyzing the ΔRS of the electrodeposited copper foils of Examples 1 to 5 and charge-discharge cycle lives of the lithium-ion secondary batteries comprising the same, the charge-discharge cycle life of the lithium-ion secondary battery could be further prolonged when the ΔRS was reduced as much as possible to 60 MPa or less, making the charge-discharge cycle lives of the lithium-ion secondary batteries of Examples 2B, 3B, and 5B reached 950 times or more. Likely, reducing the ΔRS as much as possible to 45 MPa or less allowed the lithium-ion secondary batteries of Examples 3B and 5B to have the charge-discharge cycle lives reaching 1100 times or more. Further, reducing the ΔRS of the electrodeposited copper foil as much as possible to 20 MPa or less allowed the lithium-ion secondary battery of Example 5B to have the charge-discharge cycle life reaching 1200 times or more.

In summary, multiple technical means of controlling the characteristics of the electrodeposited copper foil are provided in the instant disclosure. For example, the technical means of controlling two characteristics of the ΔRS as well as the Vv of the deposited side of the electrodeposited copper foil, controlling two characteristics of the Sku of the deposited side as well as the Vv of the deposited side of the electrodeposited copper foil, and controlling three characteristics of the ΔRS as well as Sku of the deposited side and the Vv of the deposited side of the electrodeposited copper foil indeed significantly improve the quality of the electrodeposited copper foil, exerting the beneficial effects of extension of the charge-discharge cycle life when it is applied to the lithium-ion secondary battery as well as improving the useful lifetime and performance of the lithium-ion secondary battery, and all foresaid beneficial effects have been proved by the experimental results.

What is claimed is:

1. An electrodeposited copper foil comprising a deposited side and a drum side opposite the deposited side, wherein the deposited side and the drum side each possess a residual stress, an absolute value of a difference in the residual stress between the deposited side and the drum side is at most 95 MPa, and the deposited side exhibits a void_volume (Vv) in a range from 0.15 $\mu m^3/\mu m^2$ to 1.35 $\mu m^3/\mu m^2$, and the deposited side of the electrodeposited copper foil has a Kurtosis (Sku) in a range from 1.5 to 6.5.

2. The electrodeposited copper foil as claimed in claim 1, wherein the deposited side of the electrodeposited copper foil has the Sku in the range from 1.6 to 6.2.

3. The electrodeposited copper foil as claimed in claim 2, wherein the deposited side of the electrodeposited copper foil has the Sku in the range from 1.7 to 5.8.

4. The electrodeposited copper foil as claimed in claim 1, wherein the drum side of the electrodeposited copper foil has a Sku in a range from 1.5 to 6.5.

5. The electrodeposited copper foil as claimed in claim 1, wherein the deposited side of the electrodeposited copper foil exhibits the Vv in the range from 0.15 $\mu m^3/\mu m^2$ to 1.30 $\mu m^3/\mu m^2$.

6. The electrodeposited copper foil as claimed in claim 5, wherein the deposited side of the electrodeposited copper foil exhibits the Vv in the range from 0.16 $\mu m^3/\mu m^2$ to 1.18 $\mu m^3/\mu m^2$.

7. The electrodeposited copper foil as claimed in claim 6, wherein the deposited side of the electrodeposited copper foil exhibits the Vv in the range from 0.17 $\mu m^3/\mu m^2$ to 1.11 $\mu m^3/\mu m^2$.

8. The electrodeposited copper foil as claimed in claim 1, wherein the absolute value of the difference in the residual stress between the deposited side and the drum side of the electrodeposited copper foil is at most 85 MPa.

9. The electrodeposited copper foil as claimed in claim 1, wherein the absolute value of the difference in the residual stress between the deposited side and the drum side of the electrodeposited copper foil is in a range from 5 MPa to 95 MPa.

10. The electrodeposited copper foil as claimed in claim 9, wherein the absolute value of the difference in the residual stress between the deposited side and the drum side of the electrodeposited copper foil is in the range from 5 MPa to 60 MPa.

11. The electrodeposited copper foil as claimed in claim 1, wherein the deposited side of the electrodeposited copper foil exhibits a core void volume (Vvc) in a range from 0.14 $\mu m^3/\mu m^2$ to 1.15 $\mu m^3/\mu m^2$.

12. The electrodeposited copper foil as claimed in claim 1, wherein the deposited side of the electrodeposited copper foil exhibits a dale void volume (Vvv) of at most 0.15 $\mu m^3/\mu m^2$.

13. The electrodeposited copper foil as claimed in claim 1, wherein the drum side of the electrodeposited copper foil exhibits a Vv in a range from 0.15 $\mu m^3/\mu m^2$ to 1.30 $\mu m^3/\mu m^2$.

14. The electrodeposited copper foil as claimed in claim 1, wherein the electrodeposited copper foil comprises a bare copper foil and a surface-treated layer disposed on the bare copper foil, and the drum side and the deposited side are located at outermost sides of the electrodeposited copper foil.

15. A current collector for a lithium-ion secondary battery, comprising the electrodeposited copper foil as claimed in claim 1.

16. An electrode for a lithium-ion secondary battery, comprising the current collector as claimed in claim 15 and an active substance coated on the current collector.

17. A lithium-ion secondary battery, comprising the electrode as claimed in claim 16.

18. An electrodeposited copper foil comprising a deposited side and a drum side opposite the deposited side, wherein the deposited side has a Sku in a range from 1.5 to 6.5, and the deposited side exhibits a Vv in a range from 0.15 $\mu m^3/\mu m^2$ to 1.35 $\mu m^3/\mu m^2$.

19. The electrodeposited copper foil as claimed in claim 18, wherein the deposited side of the electrodeposited copper foil has the Sku in the range from 1.6 to 6.2.

20. The electrodeposited copper foil as claimed in claim 19, wherein the deposited side of the electrodeposited copper foil has the Sku in the range from 1.7 to 5.8.

21. The electrodeposited copper foil as claimed in claim 18, wherein the drum side of the electrodeposited copper foil has a Sku in a range from 1.5 to 6.5.

22. The electrodeposited copper foil as claimed in claim 18, wherein the deposited side of the electrodeposited copper foil exhibits the Vv in the range from 0.15 $\mu m^3/\mu m^2$ to 1.30 $\mu m^3/\mu m^2$.

23. The electrodeposited copper foil as claimed in claim 22, wherein the deposited side of the electrodeposited copper foil exhibits the Vv in the range from 0.17 $\mu m^3/\mu m^2$ to 1.11 $\mu m^3/\mu m^2$.

24. The electrodeposited copper foil as claimed in claim 22, wherein the deposited side of the electrodeposited copper foil exhibits a Vvc in a range from 0.14 $\mu m^3/\mu m^2$ to 1.15 $\mu m^3/\mu m^2$.

25. The electrodeposited copper foil as claimed in claim 22, wherein the deposited side of the electrodeposited copper foil exhibits a Vvv of at most 0.15 $\mu m^3/\mu m^2$.

26. The electrodeposited copper foil as claimed in claim 22, wherein the drum side of the electrodeposited copper foil exhibits a Vv in a range from 0.15 $\mu m^3/\mu m^2$ to 1.30 $\mu m^3/\mu m^2$.

27. The electrodeposited copper foil as claimed in claim 18, wherein the electrodeposited copper foil comprises a bare copper foil and a surface-treated layer disposed on the bare copper foil, and the drum side and the deposited side are located at outermost sides of the electrodeposited copper foil.

28. A current collector for a lithium-ion secondary battery, comprising the electrodeposited copper foil as claimed in claim 18.

29. An electrode for a lithium-ion secondary battery, comprising the current collector as claimed in claim 28 and an active substance coated on the current collector.

30. A lithium-ion secondary battery, comprising the electrode as claimed in claim 29.

\* \* \* \* \*